United States Patent
Tung et al.

(10) Patent No.: US 12,236,332 B2
(45) Date of Patent: Feb. 25, 2025

(54) COMPUTE-IN-MEMORY MACRO DEVICE AND ELECTRONIC DEVICE

(71) Applicant: Novatek Microelectronics Corp., Hsinchu (TW)

(72) Inventors: Chien Te Tung, Taipei (TW); Jen-Wei Liang, Taipei (TW); Chih Feng Juan, New Taipei (TW)

(73) Assignee: Novatek Microelectronics Corp., Hsinchu (TW)

( * ) Notice: Subject to any disclaimer, the term of this patent is extended or adjusted under 35 U.S.C. 154(b) by 105 days.

(21) Appl. No.: 17/743,473

(22) Filed: May 13, 2022

(65) Prior Publication Data

US 2022/0366947 A1    Nov. 17, 2022

Related U.S. Application Data

(60) Provisional application No. 63/187,952, filed on May 13, 2021.

(51) Int. Cl.
*G06N 3/04*    (2023.01)
*G06F 7/499*    (2006.01)
(Continued)

(52) U.S. Cl.
CPC ........... *G06N 3/04* (2013.01); *G06F 7/49942* (2013.01); *G06F 15/7842* (2013.01);
(Continued)

(58) Field of Classification Search
CPC ........ G06N 3/04; G06N 3/0464; G06N 3/063; G06F 7/49942; G06F 15/7842;
(Continued)

(56) References Cited

U.S. PATENT DOCUMENTS 10,636,481 B1 *  4/2020  Chang .................... G11C 11/419
11,018,687 B1 *  5/2021  Srivastava .............. G11C 11/54
(Continued)

FOREIGN PATENT DOCUMENTS

TW    I720524     3/2021
TW    202117561   5/2021

OTHER PUBLICATIONS

"Notice of allowance of Taiwan Counterpart Application", issued on Feb. 8, 2023, p. 1-p. 3.

*Primary Examiner* — Douglas King
(74) *Attorney, Agent, or Firm* — JCIPRNET

(57) ABSTRACT

A compute-in-memory (CIM) macro device and an electronic device are proposed. The CIM macro device includes a CIM cell array including multiple CIM cells. First data is being divided into at least two bit groups including a first bit group which is the most significant bits of the first data and a second bit group which is the least significant bits of the first data, and the bit groups are respectively loaded in CIM cells of different columns of the CIM cell array. The electronic device includes at least one CIM macro and at least one processing circuit. The processing circuit is configured to receive and perform operation on parallel outputs respectively corresponding to the columns of the CIM cell array, where the parallel outputs include multiple correspondences, and where each of the correspondences includes most significant bits of an output activation and least significant bits of the output activation.

19 Claims, 2 Drawing Sheets

(51) Int. Cl.
 *G06F 15/78* (2006.01)
 *G11C 7/10* (2006.01)
(52) U.S. Cl.
 CPC .......... *G11C 7/1012* (2013.01); *G11C 7/1063* (2013.01); *G11C 7/109* (2013.01)
(58) Field of Classification Search
 CPC . G06F 15/7821; G11C 7/1012; G11C 7/1063; G11C 7/109; G11C 7/1006; G11C 5/025; G11C 11/54; Y02D 10/00
 See application file for complete search history.

(56) References Cited

U.S. PATENT DOCUMENTS

| | | |
|---|---|---|
| 11,132,176 B2 | 9/2021 | Hung et al. |
| 11,354,123 B2 | 6/2022 | Chang et al. |
| 2020/0193293 A1* | 6/2020 | Song .......................... G06F 7/74 |
| 2020/0301667 A1 | 9/2020 | Hung et al. |
| 2021/0089865 A1 | 3/2021 | Wang et al. |
| 2021/0117187 A1 | 4/2021 | Chang et al. |
| 2021/0349689 A1* | 11/2021 | Lu ............................. G11C 5/02 |
| 2022/0351032 A1* | 11/2022 | Chou .................... G06N 3/0464 |
| 2022/0375508 A1* | 11/2022 | Chang .................. G11C 11/4091 |
| 2023/0054986 A1* | 2/2023 | Yoneda ............. H01L 27/14643 |
| 2023/0074229 A1* | 3/2023 | Jia ........................ G06F 15/7821 |

\* cited by examiner

COMPUTE-IN-MEMORY MACRO DEVICE AND ELECTRONIC DEVICE

CROSS-REFERENCE TO RELATED APPLICATION

This application claims the priority benefit of U.S. Provisional application Ser. No. 63/187,952, filed on May 13, 2021. The entirety of the above-mentioned patent application is hereby incorporated by reference herein and made a part of this specification.

TECHNICAL FIELD

The disclosure relates to a compute-in-memory (CIM) macro device and an electronic device.

BACKGROUND

CIM is a technology used to solve the bandwidth versus computation mismatching problem within the popular and well-used von-Neumann processor/architecture. By combining the memory and the computation in the same block, the bandwidth mismatching problem can be solved. However, the bit-width for the computation is limited to the original width of a physical CIM macro, and hence the computation precision cannot be adjusted for higher precision application requirements.

SUMMARY OF THE DISCLOSURE

A CIM macro device and an electronic device are proposed.

According to one of the exemplary embodiments, the CIM macro device includes a CIM cell array including multiple CIM cells. First data is being divided into at least two bit groups including a first bit group which is the most significant bits of the first data and a second bit group which is the least significant bits of the first data, and the at least two bit groups are respectively loaded in CIM cells of different columns of the CIM cell array.

According to one of the exemplary embodiments, the electronic device includes at least one CIM macro and at least one processing circuit. Each CIM macro includes a CIM cell array including multiple CIM cells. First data is being divided into at least two bit groups including a first bit group which is the most significant bits of the first data and a second bit group which is the least significant bits of the first data. The at least two bit groups of the first data are respectively loaded in CIM cells of different columns of the CIM cell array, and second data is input to the CIM cells of the different columns of the CIM cell array after the first data is loaded in the CIM cells of the different columns. The processing circuit is configured to receive and perform operation on multiple parallel outputs respectively corresponding to the columns of the CIM cell array, where the parallel outputs comprise multiple correspondences, and where each of the correspondences comprises most significant bits of an output activation and least significant bits of the output activation.

It should be understood, however, that this summary may not contain all of the aspect and embodiments of the disclosure and is therefore not meant to be limiting or restrictive in any manner. Also, the disclosure would include improvements and modifications which are obvious to one skilled in the art.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

To make the above features and advantages of the application more comprehensible, several embodiments accompanied with drawings are described in detail as follows.

DESCRIPTION OF THE EMBODIMENTS

Figure 1:
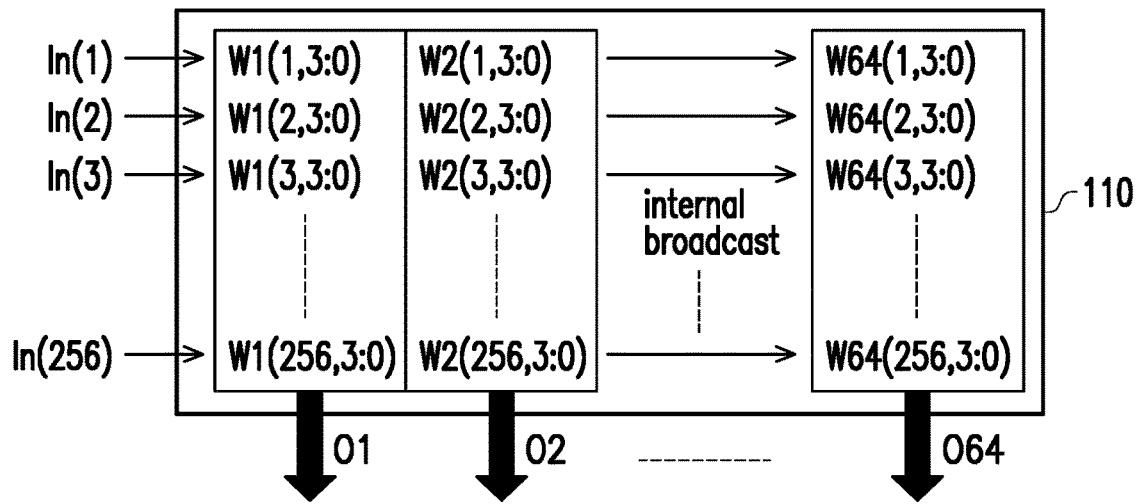
FIG. 1 illustrates a schematic diagram of a conventional CIM macro device.

FIG. 1 illustrates a schematic diagram of a conventional CIM macro.

An image input may be computed through a neural network model to acquire more features. An input feature map includes multiple input activations and multiple input feature maps are also called input channels. Multiple weights applied to the input feature map is regarded as a filter. By convolution operation applied to the input channels with the filters, an output feature map including multiple output activations, called an output channel, is generated. Referring to FIG. 1 as an example, a single macro device 110 would include 256 rows and 64 columns of a CIM cell array, where the bit-width of the computation is a small fixed number (e.g. 4), supporting storing only 4-bit data such as a 4-bit (signed or unsigned) weight $Wi(k,3:0)$ in neutral network computing. In such case, 4-bit weights $Wi(k,3:0)$ is proper to be preload to the macro device 110 in advance. For applying convolution operation to signed or unsigned 8-bit inputs (a.k.a. input activations) $In(k)$, 20-bit parallel outputs are generated, $Oi = \Sigma_{k=1}^{256} In(k) \times Wi(k,3:0)$, $i=1, 2, \ldots, 64 \in N$. In the following embodiments, the bit-width of the computation can be expanded into a larger number (e.g. 8) without changing the bit-width of the physical CIM macro computation to facilitate different bit-width requirements of computation.

To solve the prominent issue, some embodiments of the disclosure will now be described more fully hereinafter with reference to the accompanying drawings, in which some, but not all embodiments of the application are shown. Indeed, various embodiments of the disclosure may be embodied in many different forms and should not be construed as limited to the embodiments set forth herein; rather, these embodiments are provided so that this disclosure will satisfy applicable legal requirements. Like reference numerals refer to like elements throughout.

Figure 2:
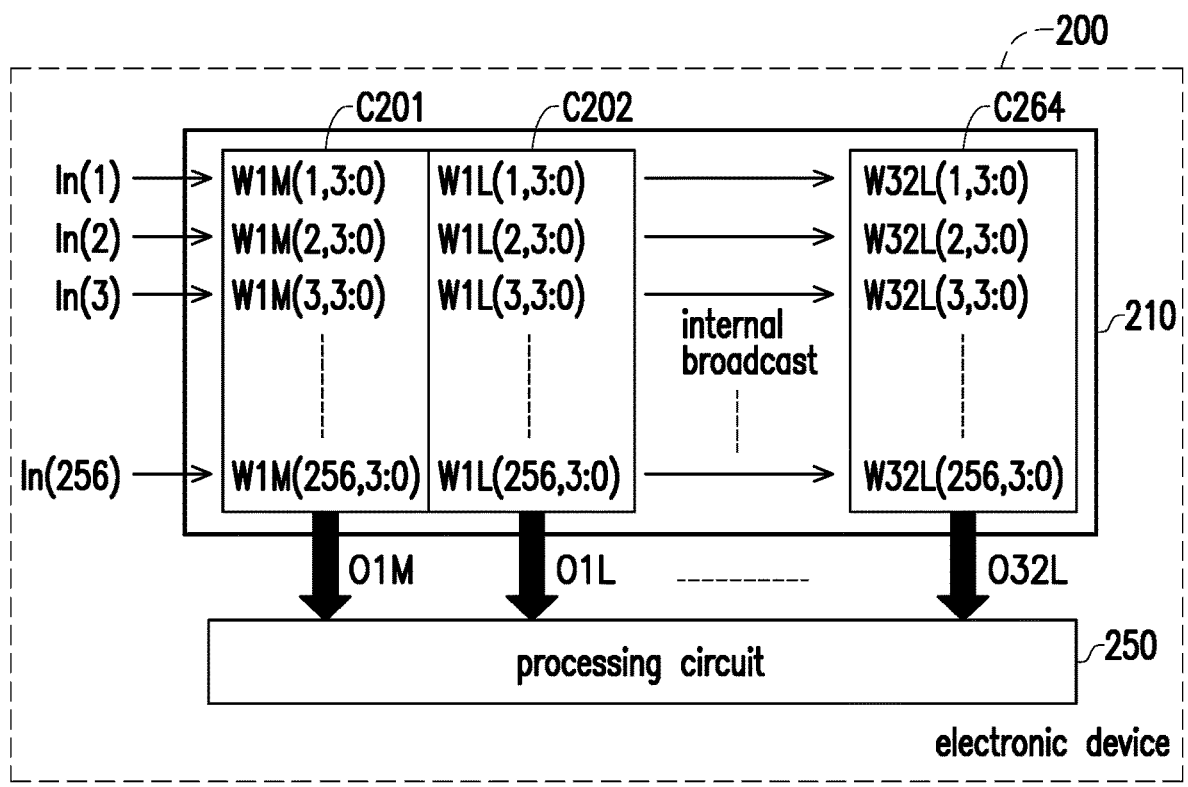
FIG. 2 illustrates a schematic diagram of a proposed electronic device in accordance with one of the exemplary embodiments of the disclosure.

FIG. 2 illustrates a schematic diagram of a proposed electronic device in accordance with one of the exemplary embodiments of the disclosure.

Referring to FIG. 2, an electronic device 200 includes at least one CIM macro 210 and at least one processing circuit 250. The CIM macro 210 includes multiple CIM cells formed as a CIM cell array of 256 rows and 64 columns denoted by C201-C264. Bit-width of each CIM cell of the CIM cell array is 4 bits. First data which has a bit-width larger than the bit-width of each CIM cell, such as 8 bits, is being divided into two bit groups including a first bit group which is the most significant bits of the first data and a second bit group which is the least significant bits of the first data. The two bit groups of the first data are respectively loaded in CIM cells of different columns of the CIM cell array.

In one example, second data is input to the CIM cells of the different columns of the CIM cell array after the first data is loaded in the CIM cells of the different columns, where the first data is a weight and the second data is an input activation. In another example, second data is input to the CIM cells of the different columns of the CIM cell array after the first data is loaded in the CIM cells of the different columns, where the first data is an input activation and the second data is a weight.

In the present exemplary embodiment, the first bit group of the first data is loaded in one CIM cell of an odd column of the CIM cell array (e.g., one of the columns C201, C203, ... C263) and the second bit group of the first data is loaded in one CIM cell of an even column of the CIM cell array (e.g., one of the columns C202, C204, ... C264). As an example, an 8-bit unsigned weight may be split into the first bit group and the second bit group, where the most significant bits may be loaded in an odd column, and the least significant bits may be loaded in an even column adjacent to the aforesaid odd column. As another example, an 8-bit signed weight may be split into the first bit group and the second bit group, where the most significant bits may include a signed bit and may be loaded in an odd column and the least significant bits may be loaded in an even column adjacent to the aforesaid odd column. For illustrative purposes, W1M(k,3:0) and W1L(k,3:0) respectively denote signed most significant bits and unsigned least significant bits of an 8-bit weight, where k=1, 2, ..., 256∈N. The rest can be deduced accordingly. As illustrated in FIG. 2, each row of CIM cells may store thirty-two 8-bit weights (or thirty-two 8-bit input activation).

In the present exemplary embodiment, the processing circuit 250 is configured to receive and perform operation on multiple parallel outputs respectively corresponding to the columns C201-C264 of the CIM cell array. The parallel outputs include multiple correspondences, where each of the correspondences includes most significant bits of an output activation and least significant bits of the output activation. For example, a correspondence of the column C201 is a summation of W1M(1,3:0) to W1M(256,3:0), a correspondence of the column C202 is a summation of W1L(1,3:0) to W1L(256,3:0). Each CIM cell of the CIM cell array are used for a convolution operation of the first data and the second data, where one of the first data and the second data is a weight and the other one is an input activation.

Herein, the parallel outputs include 32 correspondences, where each of the correspondences include most significant bits of an output activation and least significant bits of the output activation. For illustrative purposes, parallel outputs O1M and O1L respectively representing most significant bits and least significant bits of an output activation O1 are considered as one correspondence. For each of the correspondences, the processing circuit 250 shifts the most significant bits of the output activation and adds the shifted most significant bits of the output activation to the least significant bits of the output activation, where the output activation may be represented as Oi=OiM<<4+OiL, i=1, 2, ..., 32∈N. In a case where the weights are signed, for each of the correspondence, the processing circuit 250 shifts the most significant bits of the output activation including a signed bit and adds the shifted most significant bits of the output activation including the shifted signed bit with the least significant bits of the output activation.

In another exemplary embodiment, bits of each of the weights may be split into more than two bit groups. In such case, the number of bits of each of the bit groups may be determined based on the number of bits per CIM cell, and each of the bit groups includes a part of bits of the first data, and the bit groups are respectively loaded in different CIM cells belonging to different groups of columns of the CIM cell array, where the different groups of columns are grouping based on a common difference between every two adjacent columns of each group of columns. As an example, for a 10-bit weight to be stored in a CIM cell array of bit-width 4-bits, the 10-bit weight may be split into three bit groups: a first bit group may contain the most significant 4 bits, a second bit group may contain the least significant 4 bits, and an intermediate group may contain the remaining 2 bits. The number of bits of each bit group of the first data may be not exceed the bit-width of the CIM cell. As another example, for a 12-bit weight, the bits may be evenly spit into three bit groups: each of the first bit group, the intermediate bit group, and the second bit group may all contain 4 bits. Note that in both examples, the first bit group may be loaded into an $m^{th}$ column of CIM cells among the columns C201-C264, the intermediate bit group may be loaded into an $(m+1)^{th}$ column of CIM cells among the columns C201-C264, and the second bit group may be loaded into an $(m+2)^{th}$ column of CIM cells among the columns C201-C264, where m ∈ N. In this example, the common difference between every two neighbouring columns in each group of columns is three columns. The processing circuit 150 may receive and perform operation on multiple parallel outputs respectively corresponding to the columns of CIM cell array in a similar fashion to the previous exemplary embodiment.

Figure 3:
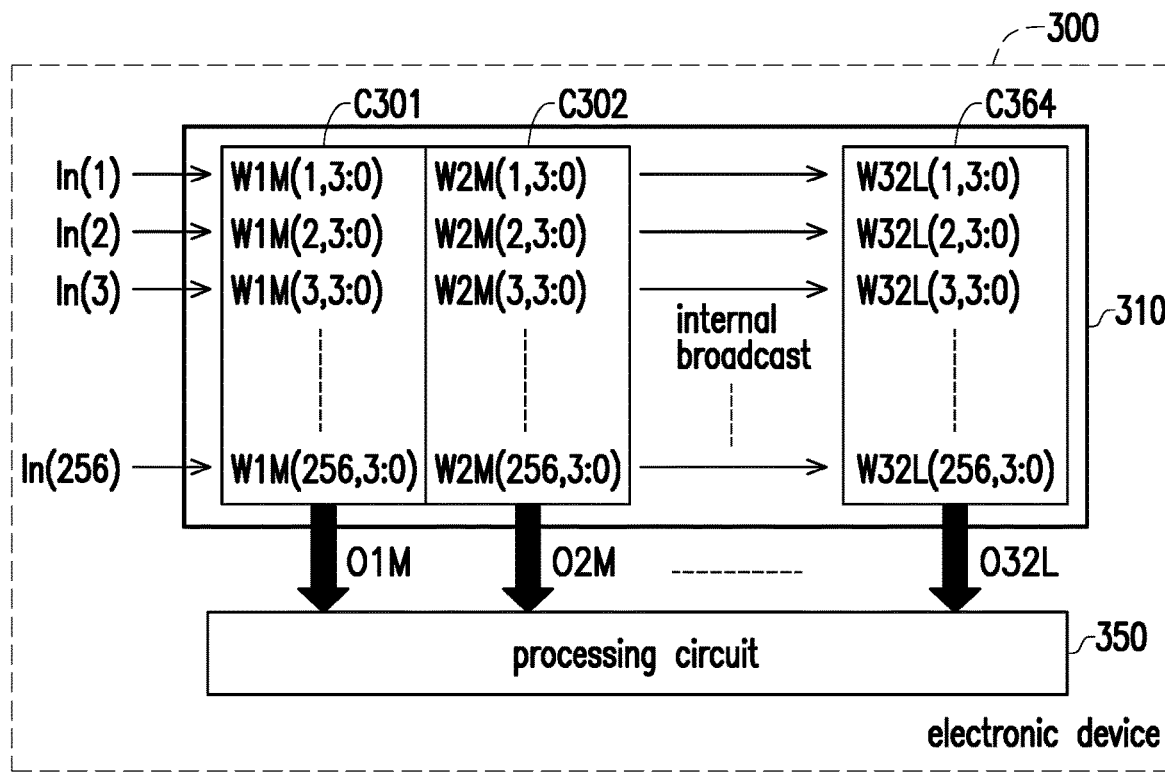
FIG. 3 illustrates a schematic diagram of another proposed electronic device in accordance with one of the exemplary embodiments of the disclosure.

FIG. 3 illustrates a schematic diagram of another proposed electronic device in accordance with one of the exemplary embodiments of the disclosure.

Referring to FIG. 3, an electronic device 300 at least one CIM macro 310 and at least one processing circuit 350. The CIM macro 310 includes multiple CIM cells formed as a CIM cell array of 256 rows and 64 columns denoted by C301-C364. Bit-width of each CIM cell of the CIM cell array is 4 bits. Herein, each bit group includes a part of bits of the first data and is loaded in a CIM cell of a group of columns which includes consecutive columns. In the present exemplary embodiment, the first 32 consecutive columns of CIM cells C301-C332 are referred to as "a first group of columns", and the last 32 consecutive columns of CIM cells C333-C364 are referred to as "a second group of columns". The most significant bits and least significant bits of each of the weights are respectively loaded in different groups of columns of the columns of CIM cells C301-C364. In the present exemplary embodiment, the most significant bits of each of the weights are loaded in the first group of columns C301-C332, and the least significant bits of each of the weights are loaded in the second group of columns C333-C364. As an example, an 8-bit unsigned weight can be split into two columns, where the most significant bits may be loaded in a first column in the first group of columns C301-C332 and the least significant bits may be loaded in a first column in the second group of columns C333-C364. As another example, an 8-bit signed weight can be split into two columns, where the most significant bits may include a signed bit and may be loaded in a first column of the first group of columns C301-C332 and the least significant bits may be loaded in a first column in the second group of columns C333-C364. For illustrative purposes, W1M(k,3:0) and W1L(k,3:0) respectively denote signed most significant bits and unsigned least significant bits of an 8-bit weight, where k=1, 2, . . . , 256∈N. The rest can be deduced accordingly.

Similarly, the processing circuit 350 is configured to receive and perform operation on multiple parallel outputs respectively corresponding to the columns C301-C364 of the CIM cell array. The parallel outputs include multiple correspondences, where each of the correspondences includes most significant bits of an output activation from the first group of columns C301-C332 and least significant bits of the output activation from the second group of columns C333-C364. For illustrative purposes, parallel output O1M and O1L respectively representing most significant bits and least significant bits of an output activation O1 are considered as one correspondence. For each of the correspondences, the processing circuit 350 shifts the most significant bits of the output activation and adds the shifted most significant bits of the output activation to the least significant bits of the output activation, where the output activation may be represented as Oi=OiM<<4+OiL, i=1, 2, . . . , 32∈N. In a case where the weights are signed, for each of the correspondence, the processing circuit 350 shifts the most significant bits of the output activation including a signed bit and adds the shifted most significant bits of the output activation including the shifted signed bit to the least significant bits of the output activation.

Figure 4:
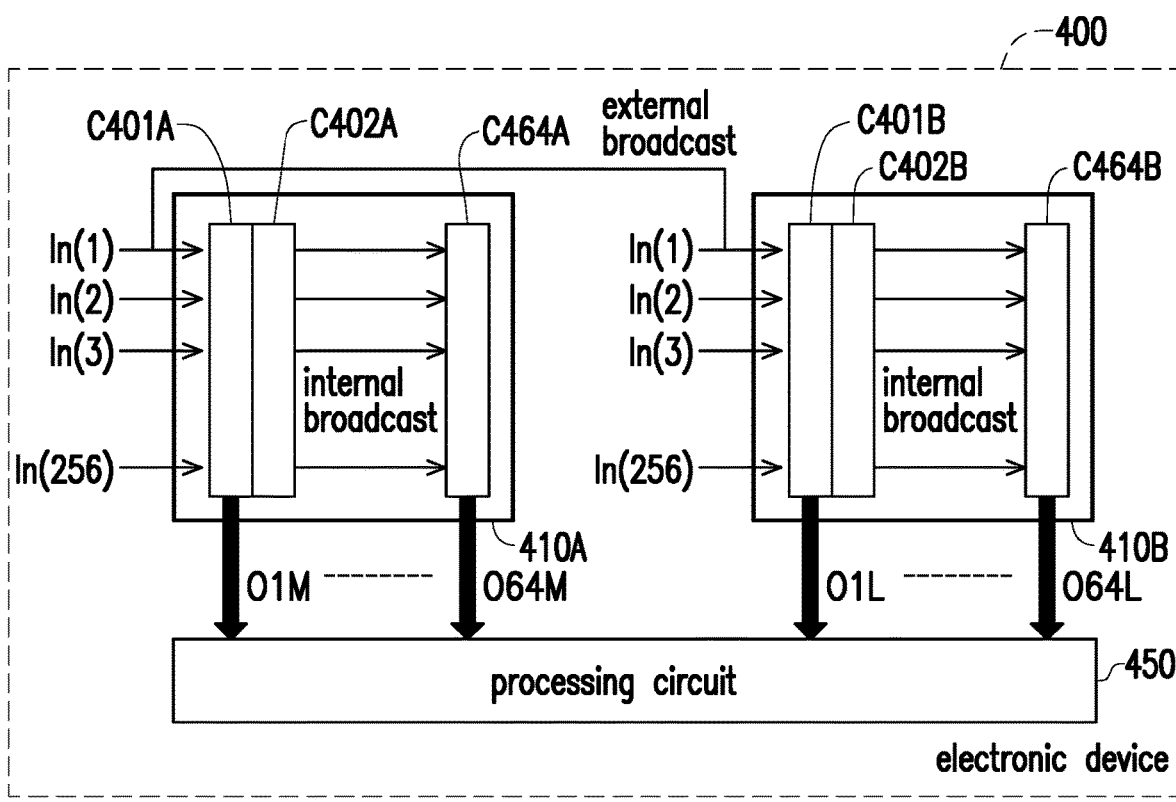
FIG. 4 illustrates a schematic diagram of another proposed electronic device in accordance with one of the exemplary embodiments of the disclosure.

FIG. 4 illustrates a schematic diagram of another proposed electronic device in accordance with one of the exemplary embodiments of the disclosure.

Referring to FIG. 4, an electronic device 400 includes a first CIM macros 410A, a second CIM macro 410B, and at least one processing circuit 450. The first CIM macro 410A includes a CIM cell array of multiple columns C401A-C464A, and the second CIM macro 410B includes a CIM cell array of multiple columns C401B-C464B. Bit-width of each CIM cell of the first CIM macro 410A and the second CIM macro 410B is 4 bits. From another perspective, the first CIM macro 410A and the second CIM macro 410B form a CIM cell array, where a portion of the CIM cells of the CIM cell array belong to the first CIM macros 410A and another portion of the CIM cells of the CIM cell array belong to the second CIM macros 410B.

The most significant bits and least significant bits of each of the weights are respectively loaded in the first CIM macro 410A and the second CIM macro 410B. As an example, an 8-bit unsigned weight can be split into two columns respectively stored in two CIM macros 410A and 410B, where the most significant bits may be loaded in a column of the first CIM macro 410A and the least significant bits may be loaded in a corresponding column of the second CIM macro 410B. As another example, an 8-bit signed weight can be split into two columns respectively stored in two CIM macros 410A and 410B, where the most significant bits may include a signed bit and may be loaded in a column of the first CIM macro 410A and the least significant bits may be loaded in a corresponding column of the second CIM macro 410B. For illustrative purposes, the column C401A of the first CIM macro 410A and the column C401B of the second CIM macro 410B are loaded by most significant bits and least significant bits of a same weight. The rest can be deduced accordingly.

The processing circuit 450 is configured to receive and perform operation on multiple parallel outputs respectively corresponding to the first CIM macro 410A and the second CIM macro 410B. The parallel outputs include 64 correspondences, where each of the correspondences include most significant bits of an output activation from the first CIM macro 410A and least significant bits of the output activation from the second CIM macro 410B. For illustrative purposes, parallel outputs O1M and O1L respectively representing most significant bits and least significant bits of an output activation O1 are considered as one correspondence. For each of the correspondence, the processing circuit 450 shifts the most significant bits of the output activation and adds the shifted most significant bits of the output activation to the least significant bits of the output activation, where the output activation may be represented as Oi=OiM<<4+OiL, i=1, 2, . . . , 64∈N. In a case where the weights are signed, for each of the correspondence, the processing circuit 450 shifts the most significant bits of the output activation including a signed bit and adds the shifted most significant bits of the output activation including the shifted signed bit to the least significant bits of the output activation.

In view of the aforementioned descriptions, the proposed technique allows the bit-width of the computation to be expanded without changing the width of the physical macro computation to facilitate different bit-width requirements of computation.

No element, act, or instruction used in the detailed description of disclosed embodiments of the present application should be construed as absolutely critical or essential to the present disclosure unless explicitly described as such. Also, as used herein, each of the indefinite articles "a" and "an" could include more than one item. If only one item is intended, the terms "a single" or similar languages would be used. Furthermore, the terms "any of" followed by a listing of a plurality of items and/or a plurality of categories of items, as used herein, are intended to include "any of", "any combination of", "any multiple of", and/or "any combination of multiples of the items and/or the categories of items, individually or in conjunction with other items and/or other categories of items. Further, as used herein, the term "set" is intended to include any number of items, including zero. Further, as used herein, the term "number" is intended to include any number, including zero.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. A data processing method, applicable to a compute-in-memory (CIM) macro device having a CIM cell array comprising a plurality of CIM cells, comprising:
dividing first data into at least two bit groups comprising a first bit group which is the most significant bits of the first data and a second bit group which is the least significant bits of the first data;
loading the at least two bit groups of the first data respectively in CIM cells of different columns of the CIM cell array;
inputting second data into the CIM cells of the different columns of the CIM array after the first data is loaded into the CIM cells of the different columns; and
performing a convolution operation on the first data and the second data by the CIM cells of the different columns of the CIM cell array to generate a plurality of parallel outputs respectively corresponding to the columns of the CIM cell array, wherein the number of the plurality of parallel outputs is equal to the number of columns of the CIM cell array.

2. The data processing method according to claim 1, wherein the first data is a weight and the second data is an input activation.

3. The data processing method according to claim 1, wherein the first data is an input activation and the second data is a weight.

4. The data processing method according to claim 1, wherein the first bit group of the first data is loaded in an odd column of the CIM cell array and the second bit group of the first data is loaded in an even column of the CIM cell array.

5. The data processing method according to claim 1, wherein the number of bits of each of the at least two bit groups are determined based on the number of bits per CIM cell.

6. The data processing method according to claim 1, wherein each of the at least two bit groups comprises a part of bits of the first data, and the at least two bit groups are respectively loaded in different CIM cells belonging to different groups of columns of the CIM cell array, and wherein the different groups of columns are grouping based on a non-zero common difference between every two adjacent columns of each group of columns.

7. The data processing method according to claim 1, wherein each of the at least two bit groups comprises a part of bits of the first data, and each bit group of the at least two bit groups is loaded in a CIM cell of a group of columns which comprises consecutive columns.

8. The data processing method according to claim 1, wherein a portion of the CIM cell array belong to a first CIM macro and another portion of the CIM cell array belong to a second CIM macro.

9. The data processing method according to claim 1, wherein the plurality of parallel outputs comprise a first parallel output and a second parallel output,
wherein the different columns comprise a first column and a second column,
wherein the first parallel output is a summation of all CIM cells of the first column, and
wherein the second parallel output is a summation of all CIM cells of the second column.

10. An electronic device comprising:
at least one compute-in-memory (CIM) macro, wherein each of the at least one CIM macro comprises a CIM cell array comprising a plurality of CIM cells;
at least one pre-processing circuit, configured to divide first data into at least two bit groups comprising a first bit group which is the most significant bits of the first data and a second bit group which is the least significant bits of the first data, load the at least two bit groups of the first data respectively in CIM cells of different columns of the CIM cell array, and input second data to the CIM cells of the different columns of the CIM cell array after the first data is loaded in the CIM cells of the different columns,
wherein the CIM cells of the different columns of the CIM cell array are configured to perform a convolution operation on the first data and the second data to generate a plurality of parallel outputs respectively corresponding to the columns of the CIM cell array, wherein the number of the plurality of parallel outputs is equal to the number of columns of the CIM cell array; and
at least one processing circuit, configured to receive and perform computation on the plurality of parallel outputs, wherein the parallel outputs comprise a plurality of correspondences, wherein each of the correspondences comprises most significant bits of an output activation and least significant bits of the output activation.

11. The electronic device according to claim 10, wherein one of the first data and the second data is a weight and the other one is an input activation.

12. The electronic device according to claim 10, wherein the most significant bits and the least significant bits of each of the weights are alternately loaded in odd columns and even columns of the columns of the CIM cells, and
wherein for each of the correspondences, the at least one processing circuit shifts the most significant bits of the output activation and adds the shifted most significant bits of the output activation to the least significant bits of the output activation.

13. The electronic device according to claim 10, wherein the weights are unsigned numbers or signed numbers.

14. The electronic device according to claim 10, wherein the number of bits of the first bit group and the number of bits of the second bit group are determined based on the number of bits per CIM cell.

15. The electronic device according to claim 10, wherein each of the at least two bit groups comprises a part of bits of the first data, and the at least one pre-processing circuit loads the at least two bit groups respectively in different CIM cells belonging to different groups of columns of the CIM cell array and groups the different groups of columns based on a non-zero common difference between every two adjacent columns of each group of columns, and
wherein for each of the correspondences, the at least one processing circuit shifts the most significant bits of the output activation and adds the shifted most significant bits of the output activation to the least significant bits of the output activation.

16. The electronic device according to claim 10, wherein each of the at least two bit groups comprises a part of bits of the first data, and the at least one pre-processing circuit loads each bit group of the at least two bit groups in a CIM cell of a group of columns which comprises consecutive columns, and
wherein for each of the correspondences, the at least one processing circuit shifts the most significant bits of the output activation and adds the shifted most significant bits of the output activation to the least significant bits of the output activation.

17. The electronic device according to claim 10, wherein a portion of the CIM cell array belong to a first CIM macro and another portion of the CIM cell array belong to a second CIM macro.

18. The electronic device according to claim 10, wherein the at least one processing circuit perform computation on the plurality of parallel outputs by shifting the most significant bits of the output activation and adding the shifted most significant bits of the output activation to the least significant bits of the output activation for each of the correspondences.

19. The data processing method, applicable to an electronic device comprising a compute-in-memory (CIM) macro device having a CIM cell array comprising a plurality of CIM cells, comprising:

dividing first data into at least two bit groups comprising a first bit group which is the most significant bits of the first data and a second bit group which is the least significant bits of the first data;

loading the at least two bit groups of the first data respectively in CIM cells of different columns of the CIM cell array;

inputting second data to the CIM cells of the different columns of the CIM cell array after the first data is loaded in the CIM cells of the different columns;

performing a convolution operation on the first data and the second data in the CIM cells of the different columns of the CIM cell array to generate a plurality of parallel outputs respectively corresponding to the columns of the CIM cell array, wherein the number of the plurality of parallel outputs is equal to the number of columns of the CIM cell array; and receiving and performing computation on the plurality of parallel outputs, wherein the parallel outputs comprise a plurality of correspondences, wherein each of the correspondences comprises most significant bits of an output activation and least significant bits of the output activation.

\* \* \* \* \*